United States Patent
Lakshmanan et al.

(10) Patent No.: US 7,273,823 B2
(45) Date of Patent: Sep. 25, 2007

(54) SITU OXIDE CAP LAYER DEVELOPMENT

(75) Inventors: Annamalai Lakshmanan, Santa Clara, CA (US); Daemian Raj, Sunnyvale, CA (US); Francimar Schmitt, Santa Clara, CA (US); Bok Hoen Kim, San Jose, CA (US); Ganesh Balasubramanian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 11/145,432

(22) Filed: Jun. 3, 2005

(65) Prior Publication Data

US 2006/0276054 A1 Dec. 7, 2006

(51) Int. Cl.
*H01L 21/31* (2006.01)
*H01L 21/409* (2006.01)

(52) U.S. Cl. .................. 438/789; 438/763; 438/788; 257/E21.277; 257/E21.576

(58) Field of Classification Search ............... 438/763, 438/788, 789
See application file for complete search history.

(56) References Cited

U.S. PATENT DOCUMENTS

| | | | |
|---|---|---|---|
| 3,297,501 A | 1/1967 | Reisman | |
| 3,306,501 A | 2/1967 | Keller | |
| 3,709,672 A | 1/1973 | DeSantis et al. | |
| 3,805,425 A | 4/1974 | Spoida et al. | |
| 3,926,774 A | 12/1975 | Watson et al. | |
| 4,324,845 A | 4/1982 | Stockel | |
| 4,425,963 A | 1/1984 | Scholz et al. | |
| 4,508,054 A | 4/1985 | Baumberger et al. | |
| 4,616,122 A | 10/1986 | Burian et al. | |
| 4,661,140 A | 4/1987 | Takimoto et al. | |
| 4,699,083 A | 10/1987 | Huet et al. | |
| 4,699,084 A | 10/1987 | Wilson et al. | |
| 4,699,805 A | 10/1987 | Seelbach et al. | |
| 4,836,558 A | 6/1989 | Anderson et al. | |
| 4,872,947 A | 10/1989 | Wang et al. | |
| 5,000,113 A | 3/1991 | Wang et al. | |
| 5,030,746 A | 7/1991 | Schilling, Jr. | |
| 5,055,169 A | 10/1991 | Hock, Jr. et al. | |

(Continued)

FOREIGN PATENT DOCUMENTS

EP 0 636 704 A1 2/1995

(Continued)

OTHER PUBLICATIONS

U.S. Appl. No. 10/840,754, filed May 6, 2004.

*Primary Examiner*—Alexander Ghyka
(74) *Attorney, Agent, or Firm*—Patterson & Sheridan

(57) ABSTRACT

A method of processing a substrate including depositing a low dielectric constant film comprising silicon, carbon, and oxygen on the substrate and depositing an oxide rich cap on the low dielectric constant film is provided. The low dielectric constant film is deposited in the presence of low frequency RF power from a gas mixture including an organosilicon compound and an oxidizing gas. The low frequency RF power is terminated after the deposition of the low dielectric constant film. The oxide rich cap is deposited on the low dielectric constant film in the absence of low frequency RF power from another gas mixture including the organosilicon compound and the oxidizing gas used to deposit the low dielectric constant film.

20 Claims, 2 Drawing Sheets

U.S. PATENT DOCUMENTS

| | | |
|---|---|---|
| 5,066,169 A | 11/1991 | Gavin et al. |
| 5,112,442 A | 5/1992 | Goodson |
| 5,160,543 A | 11/1992 | Ishihara et al. |
| 5,204,314 A | 4/1993 | Kirlin et al. |
| 5,273,588 A | 12/1993 | Foster et al. |
| 5,336,324 A | 8/1994 | Stall et al. |
| 5,372,754 A | 12/1994 | Ono |
| 5,376,409 A | 12/1994 | Kaloyeros et al. |
| 5,383,970 A | 1/1995 | Asaba et al. |
| 5,391,232 A | 2/1995 | Kanai et al. |
| 5,400,476 A | 3/1995 | White |
| 5,400,603 A | 3/1995 | Bauer et al. |
| 5,419,924 A | 5/1995 | Nagashima et al. |
| 5,421,895 A | 6/1995 | Tsubouchi et al. |
| 5,494,101 A | 2/1996 | Esser et al. |
| 5,527,567 A | 6/1996 | Desu et al. |
| 5,534,068 A | 7/1996 | Beach et al. |
| 5,558,717 A | 9/1996 | Zhao et al. |
| 5,618,761 A | 4/1997 | Eguchi et al. |
| 5,630,878 A | 5/1997 | Miyamoto et al. |
| 5,656,329 A | 8/1997 | Hampden-Smith et al. |
| 5,660,201 A | 8/1997 | Turner |
| 5,681,613 A | 10/1997 | Hansen |
| 5,725,675 A | 3/1998 | Fong et al. |
| 5,728,222 A | 3/1998 | Barbee et al. |
| 5,783,253 A | 7/1998 | Roh |
| 5,820,641 A | 10/1998 | Gu et al. |
| 5,834,060 A | 11/1998 | Kawahara et al. |
| 5,835,678 A | 11/1998 | Li et al. |
| 5,840,254 A | 11/1998 | Carver, Jr. et al. |
| 5,855,681 A | 1/1999 | Maydan et al. |
| 5,865,421 A | 2/1999 | Ono |
| 5,882,411 A | 3/1999 | Zhao et al. |
| 5,882,416 A | 3/1999 | Van Buskirk et al. |
| 5,885,356 A | 3/1999 | Zhao et al. |
| 5,900,060 A | 5/1999 | Nause et al. |
| 5,906,683 A | 5/1999 | Chen et al. |
| 5,911,834 A | 6/1999 | Fairbairn et al. |
| 5,948,704 A | 9/1999 | Benjamin et al. |
| 5,968,276 A | 10/1999 | Lei et al. |
| 6,054,206 A | 4/2000 | Mountsier |
| 6,056,823 A | 5/2000 | Sajoto et al. |
| 6,066,209 A | 5/2000 | Sajoto et al. |
| 6,068,884 A | 5/2000 | Rose et al. |
| 6,077,562 A | 6/2000 | Dornfest et al. |
| 6,140,226 A | 10/2000 | Grill et al. |
| 6,147,009 A | 11/2000 | Grill et al. |
| 6,159,871 A | 12/2000 | Loboda et al. |
| 6,202,656 B1 | 3/2001 | Schmitt |
| 6,224,681 B1 | 5/2001 | Sivaramakrishnan et al. |
| 6,350,670 B1 | 2/2002 | Andideh et al. |
| 6,486,061 B1 * | 11/2002 | Xia et al. ............ 438/680 |
| 6,498,898 B2 | 12/2002 | Schmitt |
| 6,518,646 B1 | 2/2003 | Hopper et al. |
| 6,521,302 B1 | 2/2003 | Campana-Schmitt et al. |
| 6,527,865 B1 | 3/2003 | Sajoto et al. |
| 6,593,247 B1 | 7/2003 | Huang et al. |
| 6,593,655 B1 | 7/2003 | Loboda et al. |
| 6,627,532 B1 | 9/2003 | Gaillard et al. |
| 6,656,837 B2 * | 12/2003 | Xu et al. ............ 438/676 |
| 6,784,119 B2 | 8/2004 | Gaillard et al. |
| 6,849,561 B1 | 2/2005 | Goundar |
| 6,902,440 B2 | 6/2005 | Dougan et al. |
| 6,903,004 B1 | 6/2005 | Spencer et al. |
| 6,913,992 B2 | 7/2005 | Schmitt et al. |
| 2002/0054962 A1 | 5/2002 | Huang |
| 2003/0194495 A1 | 10/2003 | Li et al. |
| 2004/0076767 A1 | 4/2004 | Satoh et al. |
| 2004/0101633 A1 | 5/2004 | Zheng et al. |
| 2004/0166665 A1 | 8/2004 | Gaillard et al. |
| 2005/0026422 A1 | 2/2005 | Kim et al. |
| 2005/0051900 A1 | 3/2005 | Liu et al. |
| 2005/0130405 A1 | 6/2005 | Spencer et al. |

FOREIGN PATENT DOCUMENTS

| | | |
|---|---|---|
| EP | 0 709 355 A1 | 5/1996 |
| EP | 0 738 788 A2 | 10/1996 |
| EP | 0 780 490 A1 | 6/1997 |
| JP | 21-48835 | 6/1990 |
| JP | 60-27690 | 2/1994 |
| JP | 07-29827 | 1/1995 |
| JP | 11-297681 | 10/1999 |

* cited by examiner

SITU OXIDE CAP LAYER DEVELOPMENT

BACKGROUND OF THE INVENTION

1. Field of the Invention

Embodiments of the present invention generally relate to the fabrication of integrated circuits. More particularly, embodiments of the present invention relate to a method and apparatus for processing a substrate that includes depositing an oxide rich cap on a low dielectric constant film.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 μm and even 0.1 μm feature sizes, and tomorrow's plants soon will be producing devices having even smaller geometries.

In order to further reduce the size of devices on integrated circuits, it has become necessary to use conductive materials having low resistivity and to use insulators having low dielectric constants (k<4) to reduce the capacitive coupling between adjacent metal lines. Recent developments in low dielectric constant films have focused on incorporating silicon (Si), carbon (C), and oxygen (O) atoms into the deposited films to form low dielectric constant organosilicate films.

The development of organosilicate films that have very low dielectric constants as well as desirable thermal and mechanical properties has been challenging. Often, films made of a Si, C, and O network that have a dielectric constant less than 2.5 exhibit poor mechanical strength and are easily damaged by subsequent substrate processing steps, such as chemical mechanical polishing, causing failure of the integrated circuit.

Plasma processes, such as plasma enhanced chemical vapor deposition (PECVD), are increasingly being used to replace thermal processes in the deposition of low dielectric constant films including silicon, carbon, and oxygen. However, one problem that has been encountered with plasma processing in integrated circuit fabrication is device damage that occurs as a result of exposure of a device to plasma conditions. It is believed that a non-uniform plasma environment may result in arcing or electric field gradients that lead to device damage.

While the susceptibility or degree of device damage typically depends at least partially on the stage of device fabrication and the type of device, many types and stages of devices can experience plasma-induced damage (PID). However, in particular, devices containing an insulating or dielectric layer deposited on a substrate are often susceptible to PID, as charges accumulate on the surface of the dielectric layer. Furthermore, as the size of device features is becoming smaller, dielectric layers are becoming thinner, and devices are becoming increasingly susceptible to PID.

Another undesirable characteristic of some low dielectric constant organosilicate films is high tensile stress. High tensile stress in a film can lead to film bowing or deformation, film cracking, film peeling, or the formation of voids in the film, which can damage or destroy a device that includes the film.

Thus, there remains a need for an improved method of depositing low dielectric constant films that minimizes plasma-induced damage and reduces tensile stress in the films.

SUMMARY OF THE INVENTION

The present invention generally provides a method of processing a substrate including depositing a low dielectric constant film on the substrate and depositing an oxide rich cap on the low dielectric constant film such that the low dielectric constant film and the oxide rich cap are adjacent to each other.

In one embodiment, the method comprises flowing an organosilicon compound and an oxidizing gas into a chamber, depositing a low dielectric constant film comprising silicon, carbon, and oxygen on a substrate in the chamber in the presence of RF power comprising low frequency RF power, turning off the low frequency RF power after the low dielectric constant film is deposited, increasing a flow rate of the oxidizing gas into the chamber, decreasing a flow rate of the organosilicon compound into the chamber, and then depositing an oxide rich cap on the low dielectric constant film in the chamber. Preferably, the low dielectric constant film is deposited in the presence of RF power that also comprises high frequency RF power, and the high frequency RF power is maintained through the deposition of the oxide rich cap. The oxide rich cap is deposited under conditions sufficient to provide a DC bias of a gas distribution manifold in the chamber of about 70 V or less.

In another embodiment, the method comprises flowing an organosilicon compound, an oxidizing gas, and a carrier gas into a chamber, depositing a low dielectric constant film comprising silicon, carbon, and oxygen on a substrate in the chamber in the presence of RF power comprising low frequency RF power and high frequency RF power, turning off the low frequency RF power after the low dielectric constant film is deposited, increasing a flow rate of the oxidizing gas into the chamber, decreasing a flow rate of the organosilicon compound into the chamber, increasing a flow rate of the carrier gas into the chamber, and then depositing an oxide rich cap on the low dielectric constant film in the chamber, while maintaining the high frequency RF power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method of depositing a low dielectric constant film on a substrate and an oxide rich cap on the low dielectric constant film. The low dielectric constant film comprises silicon, carbon, and oxygen. In one aspect, the low dielectric constant film is an organosilicate layer and has a dielectric constant of about 3 or less. The low dielectric constant film may be used at different levels within a semiconductor device. For example, the low dielectric constant film may be used as a premetal dielectric layer, an intermetal dielectric layer, or a gate dielectric layer.

As defined herein, an "oxide rich cap" is a film having a higher oxygen content than the low dielectric constant film on which it is deposited. The oxide rich cap is deposited from a gas mixture having the same components but in different amounts than the gas mixture used to deposit the low dielectric constant film and also includes silicon and carbon. The oxide rich cap is deposited immediately after the low dielectric constant film is deposited in the same chamber by maintaining a plasma and RF power in the chamber and flowing the precursors used to deposit the oxide rich cap into the chamber after the low dielectric constant film is deposited in the chamber. Since a plasma is maintained in the chamber through the deposition of the low dielectric constant film and of the oxide rich cap, the deposition of the low dielectric constant film and of the oxide rich cap may be termed "back-to-back" plasma processes.

Figure 1:
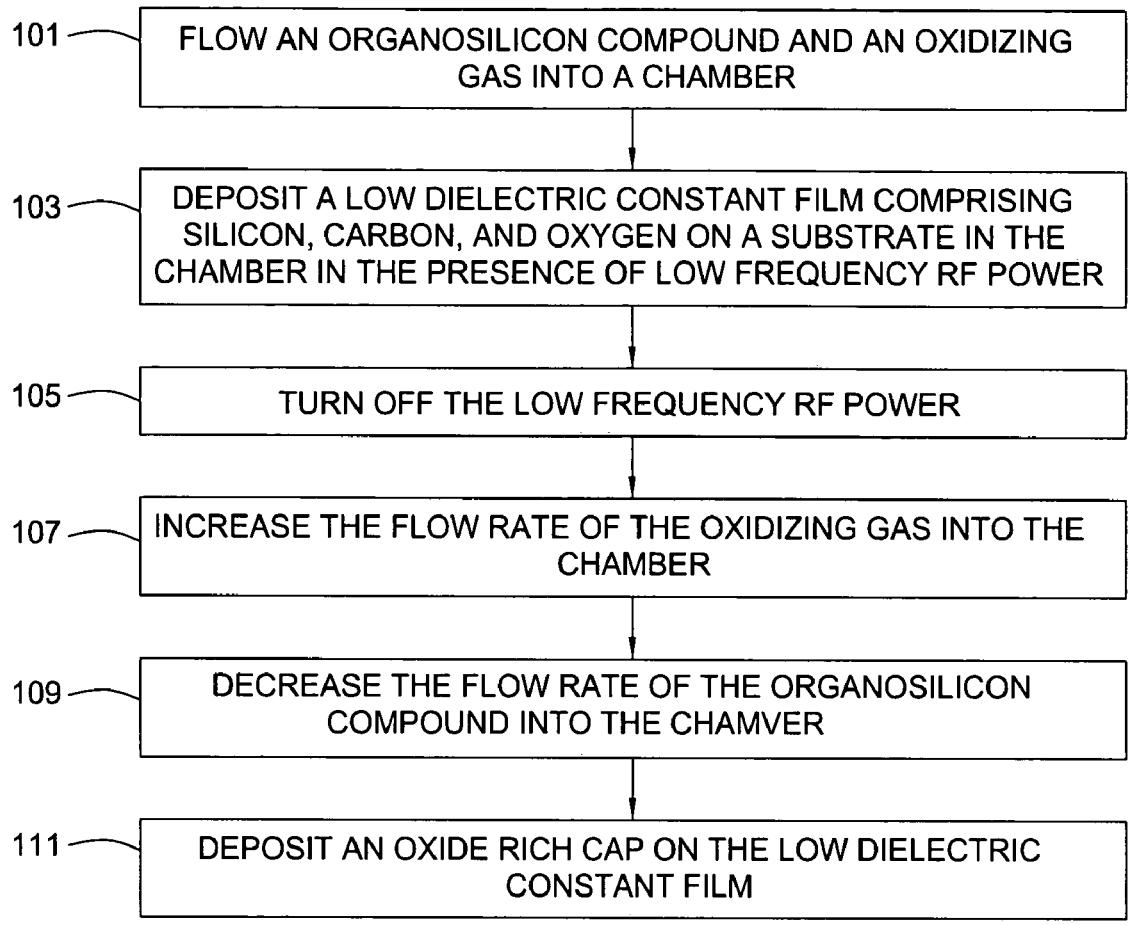
FIG. 1 is a process flow diagram illustrating a method according to an embodiment of the invention.

FIG. 1 is a process flow diagram summarizing an embodiment of the invention. In step 101, an organosilicon compound and an oxidizing gas are flowed into a chamber. In step 103, a low dielectric constant film comprising silicon, carbon, and oxygen is deposited on a substrate in the chamber from a mixture comprising the organosilicon compound and the oxidizing gas in the presence of RF power comprising low frequency RF power (LFRF). The RF power also comprises high frequency RF power. In step 105, the low frequency RF power in the chamber is turned off. In step 107, the flow rate of the oxidizing gas into the chamber is increased. In step 109, the flow rate of the organosilicon compound into the chamber is decreased. In step 111, an oxide rich cap is deposited on the low dielectric constant film. The oxide rich cap is deposited in the presence of high frequency RF power and the absence of the low frequency RF power used to deposit the low dielectric constant film. Embodiments of the invention summarized in FIG. 1 will be described in more detail below.

Figure 2:
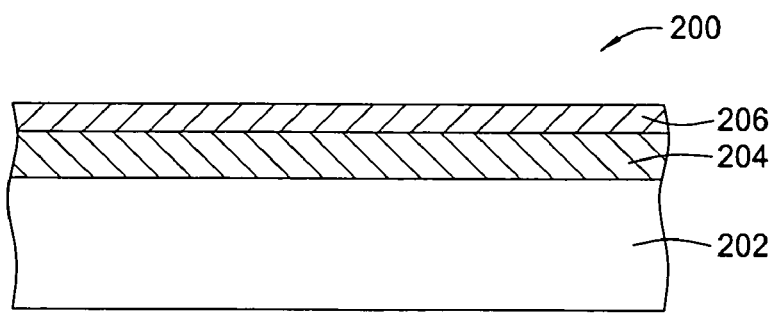
FIG. 2 is a cross-sectional view of structure including an oxide rich cap and a low dielectric constant film formed according to embodiments of the invention.

FIG. 2 schematically illustrates a cross-sectional view of a structure including layers formed according to embodiments of the invention. Structure 200 includes a low dielectric constant film 204 that is deposited on a substrate 202 according to embodiments of the invention. The substrate 202 may be a conductive, semiconductive, or insulating layer. The structure 200 also includes an oxide rich cap 206 that is deposited on the low dielectric constant film 204 such that the low dielectric constant film 204 and the oxide rich cap 206 are adjacent, i.e., the low dielectric constant film 204 and the oxide rich cap 206 contact each other. The oxide rich cap 206 is deposited according to embodiments of the invention.

Figure 3:
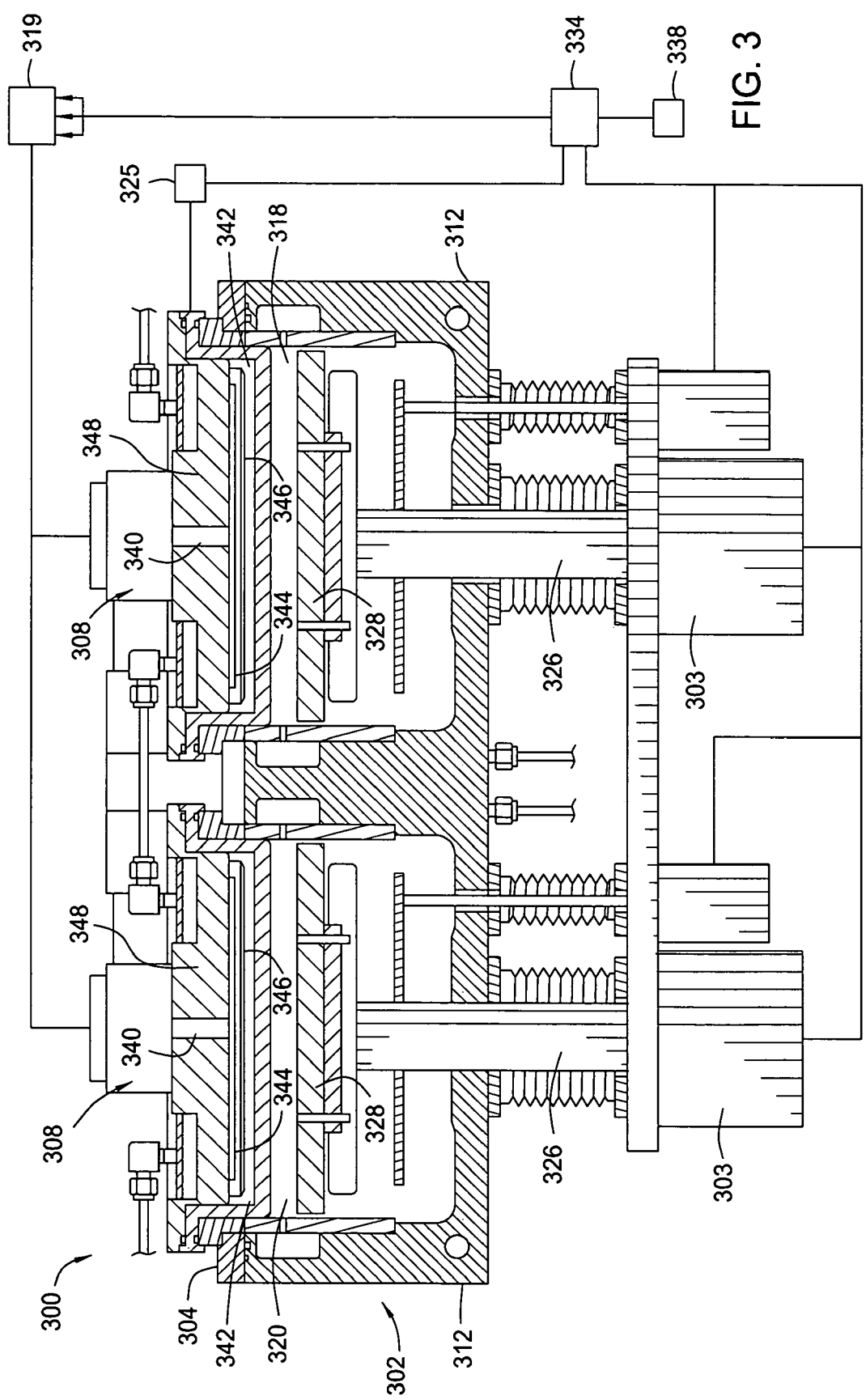
FIG. 3 is a cross-sectional schematic diagram of an exemplary processing chamber that may be used for practicing embodiments of the invention.

FIG. 3 is a cross-sectional, schematic diagram of a chemical vapor deposition (CVD) chamber 300 for depositing layers according to embodiments of the invention. An example of such a chamber is a dual or twin chamber on a PRODUCER® system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The flow rates described in the examples below and throughout the specification are the flow rates per 300 mm substrate. A chamber having two isolated processing regions is further described in U.S. Pat. No. 5,855,681, which is incorporated by reference herein. Another example of a chamber that may be used is a DxZ® chamber on a CENTURA® system, both of which are available from Applied Materials, Inc.

The CVD chamber 300 has a chamber body 302 that defines separate processing regions 318, 320. Each processing region 318, 320 has a pedestal 328 for supporting a substrate (not shown) within the CVD chamber 300. Each pedestal 328 typically includes a heating element (not shown). Preferably, each pedestal 328 is movably disposed in one of the processing regions 318, 320 by a stem 326 which extends through the bottom of the chamber body 302 where it is connected to a drive system 303.

Each of the processing regions 318, 320 also preferably includes a gas distribution assembly 308 disposed through a chamber lid 304 to deliver gases into the processing regions 318, 320. The gas distribution assembly 308 of each processing region normally includes a gas inlet passage 340 which delivers gas from a gas flow controller 319 into a gas distribution manifold 342, which is also known as a showerhead assembly. Gas flow controller 319 is typically used to control and regulate the flow rates of different process gases into the chamber. Other flow control components may include a liquid flow injection valve and liquid flow controller (not shown) if liquid precursors are used. The gas distribution manifold 342 comprises an annular base plate 348, a face plate 346, and a blocker plate 344 between the base plate 348 and the face plate 346. The gas distribution manifold 342 includes a plurality of nozzles (not shown) through which gaseous mixtures are injected during processing. An RF (radio frequency) source 325 provides a bias potential to the gas distribution manifold 342 to facilitate generation of a plasma between the showerhead assembly 342 and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the deposition chamber 300. Typically an RF voltage is applied to the cathode while the chamber body 302 is electrically grounded. Power applied to the pedestal 228 creates a substrate bias in the form of a negative voltage on the upper surface of the substrate. This negative voltage is used to attract ions from the plasma formed in the chamber 300 to the upper surface of the substrate.

During processing, process gases are uniformly distributed radially across the substrate surface. The plasma is formed from one or more process gases or a gas mixture by applying RF energy from the RF power supply 325 to the gas distribution manifold 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the gas distribution manifold 342 to enhance the decomposition of any gases introduced into the processing regions 318, 320.

A system controller 334 controls the functions of various components such as the RF power supply 325, the drive system 303, the lift mechanism 305, the gas flow controller 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the invention.

Returning to FIG. 1, the organosilicon compound that is introduced into the chamber and used to deposit the low dielectric constant film (steps 101 and 103) may be an organosiloxane, an organosilane, or a combination thereof. The term "organosilicon compound" as used herein is intended to refer to compounds containing carbon atoms in organic groups, and can be cyclic or linear. Organic groups may include alkyl, alkenyl, cyclohexenyl, and aryl groups in addition to functional derivatives thereof. Preferably, the organosilicon compounds include one or more carbon atoms attached to a silicon atom such that the carbon atoms are not readily removed by oxidation at suitable processing conditions. The organosilicon compounds may also preferably include one or more oxygen atoms.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

1,3,5-trisilano-2,4,6-trimethylene, —(—$SiH_2CH_2$—)$_3$— (cyclic)
1,3,5,7-tetramethylcyclotetrasiloxane (TMCTS), —(—$SiHCH_3$—O—)$_4$— (cyclic)
octamethylcyclotetrasiloxane (OMCTS), —(—$Si(CH_3)_2$—O—)$_4$— (cyclic)
1,3,5,7,9-pentamethylcyclopentasiloxane, —(—$SiHCH_3$—O—)$_5$— (cyclic)
1,3,5,7-tetrasilano-2,6-dioxy-4,8-dimethylene,— (—$SiH_2$—$CH_2$—$SiH_2$—O—)$_2$—
hexamethylcyclotrisiloxane, —(—$Si(CH_3)_2$—O—)$_3$— (cyclic).

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

methylsilane, $CH_3$—$SiH_3$
dimethylsilane, $(CH_3)_2$—$SiH_2$
trimethylsilane, $(CH_3)_3$—SiH
ethylsilane, $CH_3$—$CH_2$—$SiH_3$
disilanomethane, $SiH_3$—$CH_2$—$SiH_3$
bis(methylsilano)methane, $CH_3$—$SiH_2$—$CH_2$—$SiH_2$—$CH_3$
1,2-disilanoethane, $SiH_3$—$CH_2$—$CH_2$—$SiH_3$
1,2-bis(methylsilano)ethane, $CH_3$—$SiH_2$—$CH_2$—$CH_2$—$SiH_2$—$CH_3$
2,2-disilanopropane, $SiH_3$—$C(CH_3)_2$—$SiH_3$
diethylsilane, $(C_2H_5)_2$—$SiH_2$
propylsilane, $C_3H_7$—$SiH_3$
vinylmethylsilane, $(CH_2=CH)$—$SiH_2$—$CH_3$
1,1,2,2-tetramethyldisilane, $(CH_3)_2$—SiH—SiH—$(CH_3)_2$
hexamethyldisilane, $(CH_3)_3$—Si—Si—$(CH_3)_3$
1,1,2,2,3,3-hexamethyltrisilane, $(CH_3)_2$—SiH—Si$(CH_3)_2$—SiH—$(CH_3)_2$
1,1,2,3,3-pentamethyltrisilane, $(CH_3)_2$—SiH—SiH$(CH_3)$—SiH—$(CH_3)_2$
1,3-bis(methylsilano)propane, $CH_3$—$SiH_2$—$(CH_2)_3$—$SiH_2$—$CH_3$
1,2-bis(dimethylsilano)ethane, $(CH_3)_2$—SiH—$(CH_2)_2$—SiH—$(CH_3)_2$
1,3-bis(dimethylsilano)propane, $(CH_3)_2$—SiH—$(CH_2)_3$—SiH—$(CH_3)_2$
methyldiethoxysilane (MDEOS), $CH_3$—SiH—(O—$CH_2$—$CH_3)_2$
1,3-dimethyldisiloxane, $CH_3$—$SiH_2$—O—$SiH_2$—$CH_3$
1,1,3,3-tetramethyldisiloxane, $(CH_3)_2$—SiH—O—SiH—$(CH_3)_2$
hexamethyldisiloxane (HMDS), $(CH_3)_3$—Si—O—Si—$(CH_3)_3$
1,3-bis(silanomethylene)disiloxane, $(SiH_3$—$CH_2$—$SiH_2$—)$_2$—O
bis(1-methyldisiloxanyl)methane, $(CH_3$—$SiH_2$—O—$SiH_2$—)$_2$—$CH_2$
2,2-bis(1-methyldisiloxanyl)propane, $(CH_3$—$SiH_2$—O—$SiH_2$—)$_2$—$C(CH_3)_2$
dimethyldimethoxysilane (DMDMOS), $(CH_3O)_2$—Si—$(CH_3)_2$
dimethoxymethylvinylsilane (DMMVS), $(CH_3O)_2$—Si$(CH_3)$—$CH_2$=$CH_3$
phenyldimethoxysilane, $C_6H_5$—SiH—(O—$CH_3)_2$
diphenylmethylsilane, $(C_6H_5)_2$—SiH—$CH_3$
dimethylphenylsilane, $(CH_3)_2$—SiH—$C_6H_5$.

A preferred cyclic organosiloxane is octamethylcyclotetrasiloxane (OMCTS), and a preferred linear organosilane is trimethylsilane.

The oxidizing gas that is introduced into the chamber and used in a mixture with the organosilicon compound to deposit the low dielectric constant film (steps 101 and 103) may include oxygen ($O_2$), ozone ($O_3$), nitrous oxide ($N_2O$), carbon monoxide (CO), carbon dioxide ($CO_2$), water ($H_2O$), 2,3-butanedione, or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds.

One or more carrier gases may be introduced into the chamber in addition to the organosilicon compound and the oxidizing gas. Carrier gases that may be used include inert gases such as argon, helium, and combinations thereof.

In one embodiment, one organosilicon compound, one oxidizing gas, and one carrier gas are used to deposit the low dielectric constant film. In other embodiments, a mixture of one or more organosilicon compounds, one or more oxidizing gases, and one or more carrier gases may be used to deposit the low dielectric constant film.

Optionally, one or more hydrocarbon compounds may be used in depositing the low dielectric constant film. For example, in one embodiment, a low dielectric constant film is deposited from a gas mixture comprising a cyclic organosilicon compound, one or more aliphatic compounds, and one or more oxidizing gases. The one or more aliphatic compounds may include an aliphatic organosilicon compound, an aliphatic hydrocarbon, or a mixture thereof. In one embodiment, the gas mixture comprises octamethylcyclotetrasiloxane, trimethylsilane, ethylene, and oxygen. Further description of the deposition of a low dielectric constant film from such a gas mixture is provided in U.S. patent application Ser. No. 10/121,284, filed Apr. 11, 2002, which is commonly assigned and is incorporated by reference herein.

In another embodiment, a low dielectric constant film is deposited from a gas mixture including one or more organosilicon compounds, one or more hydrocarbon compounds having at least one cyclic group, and one or more oxidizing gases. For example, the gas mixture may include diethoxymethylsilane, alpha-terpinene, oxygen, and carbon dioxide. Following deposition of the low dielectric constant film, the film may be cured such as with an electron beam treatment to remove pendant organic groups, such as the cyclic groups of the hydrocarbon compounds that have been incorporated into the film network, to create pores in the low dielectric constant film. Further description of the deposition of a low dielectric constant film deposited from such a gas mixture is provided in U.S. patent application Ser. No. 10/302,393, filed Nov. 22, 2002, which is commonly assigned and is incorporated by reference herein.

Hydrocarbon compounds that may be used include aliphatic hydrocarbon compounds having between one and about 20 adjacent carbon atoms. The hydrocarbon compounds can include adjacent carbon atoms that are bonded by any combination of single, double, and triple bonds. For example, the hydrocarbon compounds may include alkenes and alkylenes having two to about 20 carbon atoms, such as ethylene, propylene, acetylene, and butadiene.

One or more hydrocarbon compounds having a cyclic group may also be used. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester, to provide hydrocarbon-based compounds that contain other atoms in addition to carbon and hydrogen. Some exemplary compounds having at least one cyclic group include alpha-terpinene (ATP), norbornadience, vinylcyclohexane (VCH), and phenylacetate.

Returning to step 101, the organosilicon compound may be introduced into the chamber at a flow rate between about 50 sccm and about 1000 sccm, e.g., 102 sccm, and maintained at that flow rate during the deposition of the low dielectric constant layer. The oxidizing compound may be introduced into the chamber at a flow rate between about 50 sccm and about 2000 sccm and maintained at that flow rate during the deposition of the low dielectric constant layer (step 103). Optionally, a carrier gas is also flowed into the chamber at a flow rate between about 500 sccm and about 5000 sccm during steps 101 and 103.

The low dielectric constant film is deposited in the presence of RF power comprising low frequency RF power (LFRF). The RF power may be applied to a gas distribution manifold or showerhead in the chamber, wherein the showerhead acts as a powered electrode. Alternatively, or additionally, RF power can be provided to the substrate support in the chamber, with the substrate support serving as a cathode in the chamber. The RF power to the chamber may be cycled or pulsed to reduce heating of the substrate and promote greater porosity in the deposited film. The low frequency RF (LFRF) power has a frequency of about 200 kHz to about 2 MHz and may have a power level between about 50 W and about 1000 W for a 300 mm substrate. The RF power may also comprise high frequency RF power having a frequency of about 500 kHz to about 13.56 MHz. The power level of the high frequency RF power may be between about 50 W and about 3000 W for a 300 mm substrate.

During the deposition of the low dielectric constant film, the substrate may be maintained at a temperature between about 150° C. and about 500° C., preferably between about 250° C. and about 450° C. The deposition pressure is typically between about 1 Torr and about 10 Torr, preferably between about 3 Torr and about 7 Torr. The spacing between the substrate and the manifold may be between about 200 mils and about 1200 mils.

After the low dielectric constant film is deposited, the low frequency RF power in the chamber is turned off, as shown in step 105. The high frequency RF power is maintained in the chamber such that plasma conditions are maintained in the chamber after the deposition of the low dielectric constant film.

The flow rate of the oxidizing gas into the chamber is increased and the flow rate of the organosilicon compound into the chamber is decreased after the deposition of the low dielectric constant film. While the termination of the low frequency RF power, the flow rate increase of the oxidizing gas, and the flow rate decrease of the organosilicon compound are shown as sequential steps, 105, 107, 109, preferably, the termination of the low frequency RF power, the flow rate increase of the oxidizing gas, and the flow rate decrease of the organosilicon compound are preferably performed simultaneously or substantially simultaneously. However, alternative orders of steps 105, 107, and 109 may be used.

The flow rate of the oxidizing gas may be increased from a flow rate between about 50 sccm and about 2000 sccm during the deposition of the low dielectric constant film to a flow rate between about 400 sccm and about 5000 sccm. The flow rate of the organosilicon compound may be decreased from a flow rate between about 50 sccm and about 1000 sccm during the deposition of the low dielectric constant film to a flow rate between about 5 sccm and about 100 sccm.

In one embodiment, the oxidizing gas flow rate and the organosilicon compound flow rate are changed such that the organosilicon compound to oxidizing gas flow rate ratio is changed from between about 1:1 and about 3:1 during the deposition of the low dielectric constant film to between about 1:75 and about 1:10 such that the oxide rich cap is deposited at an organosilicon compound to oxidizing gas flow rate ratio of between about 1:75 and about 1:10.

The flow rate of the carrier gas may be increased from a flow rate between about 500 sccm and about 5000 sccm during the deposition of the low dielectric constant film to a flow rate between about 1000 sccm and about 10000 sccm after the deposition of the low dielectric constant film.

After the flow rates of the oxidizing gas, organosilicon compound, and optional carrier gas are changed, the flow rates of the oxidizing gas, organosilicon compound, and optional carrier gas are maintained for a period of time sufficient to deposit an oxide rich cap on the low dielectric constant film, as shown in step 111. The period of time may be between about 2 seconds and about 200 seconds. The oxide rich cap may have a thickness between about 100 Å and about 3000 Å. Preferably, the substrate temperature, chamber pressure, spacing between the substrate and the manifold, and the high frequency RF power are maintained during the deposition of the oxide rich cap at the levels used during the deposition of the low dielectric constant film.

Embodiments of the invention described herein provide a method of depositing a low dielectric constant film and an oxide rich cap thereon. By depositing the low dielectric constant film from a mixture comprising an organosilicon compound and an oxidizing gas and then increasing the flow of the oxidizing gas and decreasing the flow of the organosilicon compound, an oxide rich cap having a lower carbon content than the low dielectric constant film is provided. The oxide rich cap may function as a protective layer for the underlying low dielectric constant film during subsequent processing steps, such as chemical mechanical polishing (CMP). The chemical mechanical polishing may be performed using conventional CMP techniques.

The following Examples 1 and 2 illustrate embodiments of the invention. The processes described in Examples 1 and 2 and Comparison Examples 1 and 2 were performed in a twin chamber on a PRODUCER® system, available from Applied Materials, Inc. The flow rates described in the examples are the flow rates per one substrate processing region of the PRODUCER® system, i.e., the flow rates per one 300 mm substrate.

EXAMPLE 1

A low dielectric constant film was deposited on a substrate from the following gas mixture at a chamber pressure of 5 Torr and substrate temperature of 350° C.:

Octamethylcyclotetrasiloxane (OMCTS), at about 102 sccm;

Oxygen, at about 80 sccm; and

Helium, at about 450 sccm.

The substrate was positioned 400 mils from the gas distribution manifold, and RF power of 500 W at a frequency of 13.56 MHz and RF power of 125 W at a frequency of 350 kHz were applied in the chamber. A low dielectric constant film comprising silicon, carbon, and oxygen was deposited on the substrate.

The low frequency RF power was then terminated, and the gas flow rates were adjusted as follows to deposit an oxide rich cap on the low dielectric constant film:

Octamethylcyclotetrasiloxane (OMCTS), at about 13 sccm;

Oxygen, at about 500 sccm; and

Helium, at about 2500 sccm.

The pressure, temperature, spacing, and high frequency RF power were maintained at the same levels used during the deposition of the low dielectric constant film. The oxide rich cap was deposited for 350 seconds to a thickness of 6852 Å for 350 seconds at a rate of 1175 Å/minute. The refractive index (RI) of the oxide rich cap was 1.46. The with-in-wafer non-uniformity of the oxide rich cap was 2.33% (with a standard deviation of 49 radial points on a 300 mm wafer with a 3 mm edge exclusion). The oxide rich cap had a compressive stress of −110 MPa, as measured by as measured by a FSM 128L tool, available from Frontier Semiconductor, San Jose, Calif. The oxide rich cap had a wet etch rate ratio (WERR) of 3.89. The DC bias spike, i.e., the difference between the peak and trough of the DC bias trace across the gas distribution manifold, was 46 V during the deposition of the oxide rich cap.

EXAMPLE 2

A low dielectric constant film was deposited on a substrate as described above in Example 1.

The low frequency RF power was then terminated, and the gas flow rates were adjusted as follows to deposit an oxide rich cap on the low dielectric constant film:

Octamethylcyclotetrasiloxane (OMCTS), at about 13 sccm;

Oxygen, at about 450 sccm; and

Helium, at about 2500 sccm.

The pressure, temperature, spacing, and high frequency RF power were maintained at the same levels used during the deposition of the low dielectric constant film. The oxide rich cap was deposited for 235 seconds to a thickness of 4695 Å for 350 seconds at a rate of 1199 Å/minute. The refractive index (RI) of the oxide rich cap was 1.46. The with-in-wafer non-uniformity of the oxide rich cap was 2.82%. The oxide rich cap had a compressive stress of −117 MPa, as measured by as measured by a FSM 128L tool, available from Frontier Semiconductor, San Jose, Calif. The oxide rich cap had a wet etch rate ratio (WERR) of 3.84. The DC bias spike across the gas distribution manifold was 46 V during the deposition of the oxide rich cap.

COMPARISON EXAMPLE 1

A low dielectric constant film was deposited on a substrate as described above in Example 1.

The gas flow rates were then adjusted as follows to deposit an oxide rich cap on the low dielectric constant film:

Octamethylcyclotetrasiloxane (OMCTS), at about 19 sccm;

Oxygen, at about 250 sccm; and

Helium, at about 2400 sccm.

The pressure, temperature, spacing, high frequency RF power, and low frequency RF power were maintained at the same levels used during the deposition of the low dielectric constant film. The oxide rich cap was deposited for 120 seconds to a thickness of 3415 Å for 120 seconds at a rate of 1708 Å/minute. The refractive index (RI) of the oxide rich cap was 1.47. The with-in-wafer non-uniformity of the oxide rich cap was 2.33%. The oxide rich cap had a compressive stress of −260 MPa, as measured by as measured by a FSM 128L tool, available from Frontier Semiconductor, San Jose, Calif. The oxide rich cap had a wet etch rate ratio (WERR) of 2.19. The DC bias spike across the gas distribution manifold was 100 V during the deposition of the oxide rich cap.

COMPARISON EXAMPLE 2

A low dielectric constant film was deposited on a substrate as described above in Example 1.

The gas flow rates were then adjusted as follows to deposit an oxide rich cap on the low dielectric constant film:

Octamethylcyclotetrasiloxane (OMCTS), at about 8 sccm;

Oxygen, at about 500 sccm; and

Helium, at about 2500 sccm.

The pressure, temperature, spacing, high frequency RF power, and low frequency RF power were maintained at the same levels used during the deposition of the low dielectric constant film. The oxide rich cap was deposited for 200 seconds to a thickness of 3080 Å at a rate of 924 Å/minute. The refractive index (RI) of the oxide rich cap was 1.47. The with-in-wafer non-uniformity of the oxide rich cap was 3.26%. The oxide rich cap had a compressive stress of −318 MPa, as measured by as measured by a FSM 128L tool, available from Frontier Semiconductor, San Jose, Calif. The oxide rich cap had a wet etch rate ratio (WERR) of 2.65. The DC bias spike across the gas distribution manifold was 99 V during the deposition of the oxide rich cap.

As shown by Examples 1 and 2, embodiments of the invention provide a method of depositing an oxide rich cap on a low dielectric constant film such that the DC bias spike across the gas distribution manifold is less than about 70 V, and is preferably less than about 50 V, such as between about 10 V and about 50 V. By comparison, the DC bias spikes across the gas distribution manifold during the deposition of the oxide rich caps of Comparison Examples 1 and 2 were about 100 V. While the oxide rich caps of Examples 1 and 2 and Comparison Examples 1 and 2 were deposited under similar processing conditions, the oxide rich caps of Examples 1 and 2 were deposited in the absence of LFRF power. Thus, it is believed that turning off the LFRF power after the deposition of the low dielectric constant film and depositing the oxide rich cap in the absence of LFRF power results in a lower DC bias spike across the gas distribution manifold. As it is believed that minimizing the DC bias spike reduces plasma-induced damage to substrates, it is believed that processes performed according to the embodiments described herein, such as in Examples 1 and 2, reduce plasma-induced damage to substrates.

Embodiments of the invention also provide a method of depositing an oxide rich cap such that the oxide rich cap has both a desirable wet etch rate ratio (WERR), such as between about 3 and about 5, and compressive stress, such as a stress between about −50 MPa and about −200 MPa, as measured by a FSM 128L tool.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
flowing an organosilicon compound and an oxidizing gas into a chamber;
depositing a low dielectric constant film comprising silicon, carbon, and oxygen on a substrate in the chamber using the organosilicon compound and the oxidizing gas as precursors in the presence of RE power comprising low frequency RF power;
turning off the low frequency RF power after the low dielectric constant film is deposited;
increasing a flow rate of the oxidizing gas into the chamber;
decreasing a flow rate of the organosilicon compound into the chamber; and then
depositing an oxide rich cap on the low dielectric constant film in the chamber from the organosilicon compound and the oxidizing gas.

2. The method of claim 1, wherein the chamber comprises a gas distribution manifold, and the oxide rich cap is deposited under conditions sufficient to provide a DC bias spike of the gas distribution manifold of about 70 V or less.

3. The method of claim 2, wherein the DC bias spike is between about 10 V and about 50 V.

4. The method of claim 1, wherein the organosilicon compound is octamethylcyclotetrasiloxane or trimethylsilane.

5. The method of claim 1, wherein the organosilicon compound is octamethylcyclotetrasiloxane and the oxidizing gas is oxygen.

6. The method of claim 1, wherein increasing the flow rate of the oxidizing gas comprises increasing the flow rate of the oxidizing gas from a flow rate of between about 50 sccm and about 2000 sccm during the depositing the low dielectric constant film to a flow rate of between about 400 sccm and about 5000 sccm during the depositing the oxide rich cap.

7. The method of claim 1, wherein decreasing the flow rate of the organosilicon compound comprises decreasing the flow rate of the organosilicon compound from a flow rate of between about 50 sccm and about 1000 sccm during the depositing the low dielectric constant film to a flow rate of between about 5 sccm and about 100 sccm during the depositing the oxide rich cap.

8. The method of claim 1, further comprising chemical mechanical polishing the oxide rich cap.

9. A method of processing a substrate, comprising:
flowing an organosilicon compound and an oxidizing gas into a chamber;
depositing a low dielectric constant film comprising silicon, carbon, and oxygen on a substrate in the chamber using the organosilicon compound and the oxidizing gas as precursors in the presence of RF power comprising low frequency RF power and high frequency RE power;
turning off the low frequency RE power after the low dielectric constant film is deposited;
increasing a flow rate of the oxidizing gas into the chamber;
decreasing a flow rate of the organosilicon compound into the chamber; and then
depositing an oxide rich cap on the low dielectric constant film in the chamber from the organosilicon compound and the oxidizing gas while maintaining the high frequency RE power.

10. The method of claim 9, wherein the chamber comprises a gas distribution manifold, and the oxide rich cap is deposited under conditions sufficient to provide a DC bias spike of the gas distribution manifold of about 70 V or less.

11. The method of claim 9, wherein the low frequency RE power has a frequency between about 200 kHz and about 2 MHz, and the high frequency RF power has a frequency between about 500 kHz and about 13.56 MHz.

12. The method of claim 9, wherein the low frequency power level during the deposition of the low dielectric constant film is between about 50 W and about 1000 W, and the high frequency power level during the deposition of the low dielectric constant film and during the deposition of the oxide rich cap is between about 50 W and about 3000 W.

13. The method of claim 9, wherein the organosilicon compound is octamethylcyclotetrasiloxane and the oxidizing gas is oxygen.

14. The method of claim 9, further comprising chemical mechanical polishing the oxide rich cap.

15. A method of processing a substrate, comprising:
flowing an organosilicon compound, an oxidizing gas, and a carrier gas into a chamber;
depositing a low dielectric constant film comprising silicon, carbon, and oxygen on a substrate in the chamber using the organosilicon compound and the oxidizing gas as precursors in the presence of RF power comprising low frequency RF power and high frequency RE power;
turning off the low frequency RE power after the low dielectric constant film is deposited;

increasing a flow rate of the oxidizing gas into the chamber;

decreasing a flow rate of the organosilicon compound into the chamber;

increasing a flow rate of the carrier gas in the chamber; and then depositing an oxide rich cap on the low dielectric constant film in the chamber from the organosilicon compound and the oxidizing gas while maintaining the high frequency RE power.

16. The method of claim 15, wherein the chamber comprises a gas distribution manifold, and the oxide rich cap is deposited under conditions sufficient to provide a DC bias spike of the gas distribution manifold of about 70 V or less.

17. The method of claim 15, wherein the organosilicon compound is octamethylcyclotetrasiloxane, the oxidizing gas is oxygen, and the carrier gas is helium.

18. The method of claim 15, wherein the low frequency RE power has a frequency between about 200 kHz and about 2 MHz, and the high frequency RF power has a frequency between about 500 kHz and about 13.56 MHz.

19. The method of claim 15, wherein the low frequency power level during the deposition of the low dielectric constant film is between about 50 W and about 1000 W, and the high frequency power level during the deposition of the low dielectric constant film and during the deposition of the oxide rich cap is between about 50 W and about 3000 W.

20. The method of claim 15, further comprising chemical mechanical polishing the oxide rich cap.

* * * * *

UNITED STATES PATENT AND TRADEMARK OFFICE
CERTIFICATE OF CORRECTION

| | | |
|---|---|---|
| PATENT NO. | : 7,273,823 B2 | Page 1 of 1 |
| APPLICATION NO. | : 11/145432 | |
| DATED | : September 25, 2007 | |
| INVENTOR(S) | : Annamalai Lakshmanan et al. | |

It is certified that error appears in the above-identified patent and that said Letters Patent is hereby corrected as shown below:

In the Title item (54) and col. 1, line 1:

Please insert --IN-- before "SITU".

Column 4, Line 41, please delete "228" and Insert --328--;

Column 4, Line 60, please delete "the lift mechanism 305,".

In the Claims:

Column 11, Claim 1, Line 47, please delete "RE" and insert --RF--;

Column 12, Claim 9, Line 27, please delete "RE" and insert --RF--;

Column 12, Claim 9, Line 28, please delete "RE" and insert --RF--;

Column 12, Claim 9, Line 37, please delete "RE" and insert --RF--;

Column 12, Claim 11, Line 42, please delete "RE" and insert --RF--;

Column 12, Claim 15, Line 65, please delete "RE" and insert --RF--;

Column 12, Claim 15, Line 66, please delete "RE" and insert --RF--;

Column 13, Claim 15, Line 10, please delete "RE" and insert --RF--;

Column 14, Claim 18, Line 2, please delete "RE" and insert --RF--.

Signed and Sealed this

Fourteenth Day of September, 2010

David J. Kappos
*Director of the United States Patent and Trademark Office*